United States Patent
Hwang et al.

(10) Patent No.: US 6,841,736 B2
(45) Date of Patent: Jan. 11, 2005

(54) CURRENT-CARRYING ELECTRONIC COMPONENT AND METHOD OF MANUFACTURING SAME

(75) Inventors: Lih-Tyng Hwang, Phoenix, AZ (US); Li Li, Gilbert, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/256,789

(22) Filed: Sep. 26, 2002

(65) Prior Publication Data

US 2004/0060724 A1 Apr. 1, 2004

(51) Int. Cl.⁷ .................................................. H01B 7/08
(52) U.S. Cl. .......................... 174/117 FF; 174/117 R; 174/117 AS
(58) Field of Search ................. 174/117 FF, 117 R, 174/117 AS

(56) References Cited

U.S. PATENT DOCUMENTS

| | | | |
|---|---|---|---|
| 5,527,999 A | 6/1996 | Knigga et al. | |
| 5,574,260 A | 11/1996 | Broomall et al. | |
| 5,674,780 A | 10/1997 | Lytle et al. | |
| 5,675,298 A | 10/1997 | Bhagwan et al. | |
| 5,834,995 A | 11/1998 | Richards et al. | |
| 5,922,514 A | 7/1999 | Person et al. | |
| 6,052,043 A | 4/2000 | Gotoh et al. | |
| 6,100,178 A | * 8/2000 | Todd et al. | 438/622 |
| 2001/0004132 A1 | * 6/2001 | Bergstedt et al. | 257/728 |

* cited by examiner

Primary Examiner—Dean A. Reichard
Assistant Examiner—Jinhee Lee
(74) Attorney, Agent, or Firm—Bryan Cave LLP

(57) ABSTRACT

An embodiment of a current-carrying structure (100) includes a first electrically conductive layer (110) and a second electrically conductive layer (120). The second electrically conductive layer is in contact with the first electrically conductive layer along substantially the entire length of the first electrically conductive layer. The second electrically conductive layer is above the first electrically conductive layer. A non-electrically conductive layer (130) is in contact with the first electrically conductive layer and the second electrically conductive layer. A current travels simultaneously through the first electrically conductive layer and the second electrically conductive layer.

25 Claims, 4 Drawing Sheets

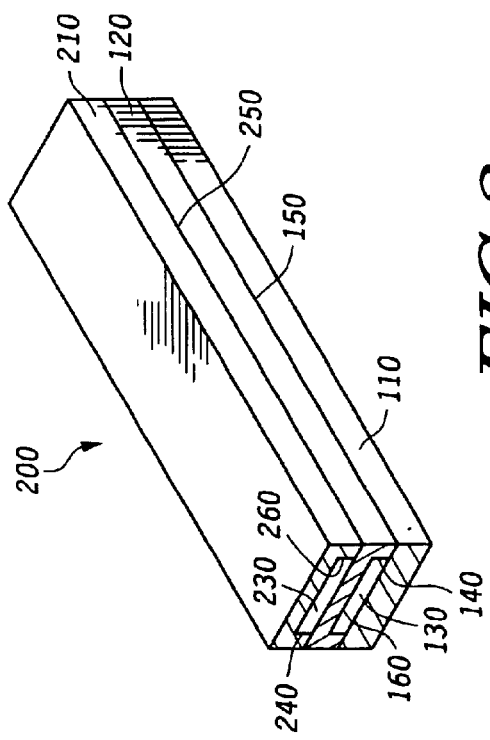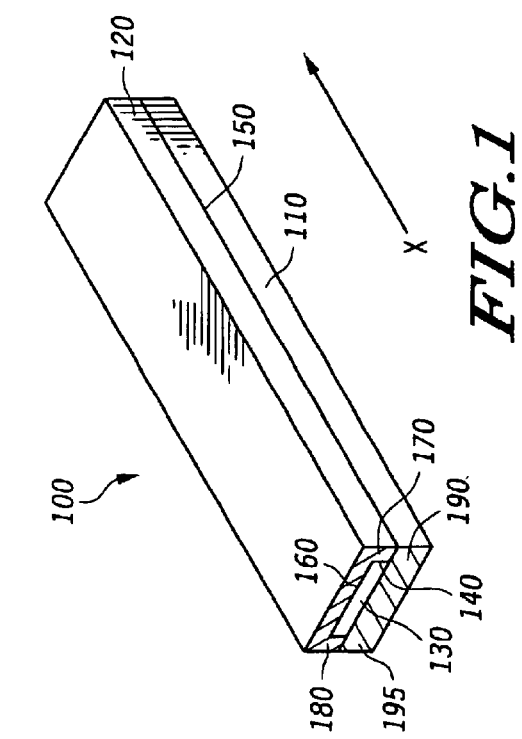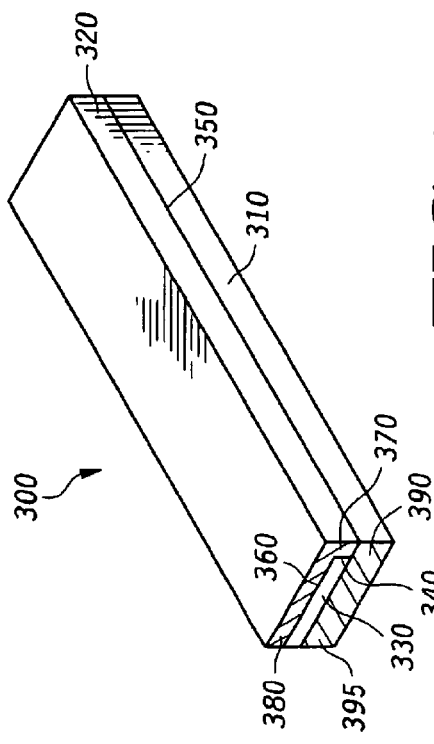

CURRENT-CARRYING ELECTRONIC COMPONENT AND METHOD OF MANUFACTURING SAME

FIELD OF THE INVENTION

This invention relates generally to electronics, and relates more particularly to electronic components having current-carrying structures and methods of manufacture.

BACKGROUND OF THE INVENTION

As the market expectation for the performance of electronic components remains focused on faster speeds and smaller sizes, designers continue to look for ways to increase electron flow between and within the components of electronic systems without increasing the size of those components. Electrically conductive materials such as copper, gold, aluminum, tin, and silver are characterized by high conductivity and low loss of electron flow. Such electrically conductive materials are thus often selected as the material for current-carrying structures such as interconnect structures within electronic components, interconnect structures between electronic components, and passive devices within electronic components. Examples of interconnect structures within an electronic component include single-level metal systems and multi-level metal systems. Examples of interconnect structures between electronic components include wire bonds, and examples of passive devices include inductors, resistors, and transformers.

Current-carrying structures are often operated at high frequencies of greater than approximately one gigahertz (GHz). At these high frequencies, however, the distribution of current or electron transmission through a current-carrying structure is compromised by a skin effect. The skin effect crowds the electrons toward an outside skin of the current-carrying structure and effectively decreases a cross-sectional current-carrying area of the current-carrying structure. The skin effect thus acts as a drag on energy efficiency and electron transmission in current-carrying structures.

Another problem for current-carrying structures such as wire bonds is that wire bonds have an inductive loss and an impedance. A high loss in a wire bond significantly affects the ability of the wire bond to carry a signal, particularly at high frequencies. Therefore, a wire bond with high loss greatly limits the distance across which the wire bond may be used as an interconnect structure between components. Furthermore, although multiple ground wire bonds may be added to an electronic component, the impedance of a wire bond with such multiple ground wire bonds is not easy to control.

The above-described skin effect and impedance problems may be reduced by increasing a surface area per unit of distance in current-carrying structures, thus increasing a current-carrying cross-section in such structures and planar controlled impedance configurations. As an example, a wider metal layer can be used to achieve this increase in current-carrying cross section, but at a significant cost of increased component size, particularly a larger footprint. Therefore, a need exists for an electronic component having a current-carrying structure with an increased current-carrying cross-section while a footprint of the electronic component does not increase in size.

BRIEF DESCRIPTION OF THE DRAWINGS

The invention will be better understood from a reading of the following detailed description, taken in conjunction with the accompanying figures in the drawings in which:

FIG. 1 is an isometric view of a cross section of a portion of a current-carrying structure according to an embodiment of the present invention;

FIG. 2 is an isometric view of a cross section of a portion of a current-carrying structure according to another embodiment of the present invention;

FIG. 3 is an isometric view of a cross section of a portion of a current-carrying structure according to another embodiment of the present invention;

Figure 4:
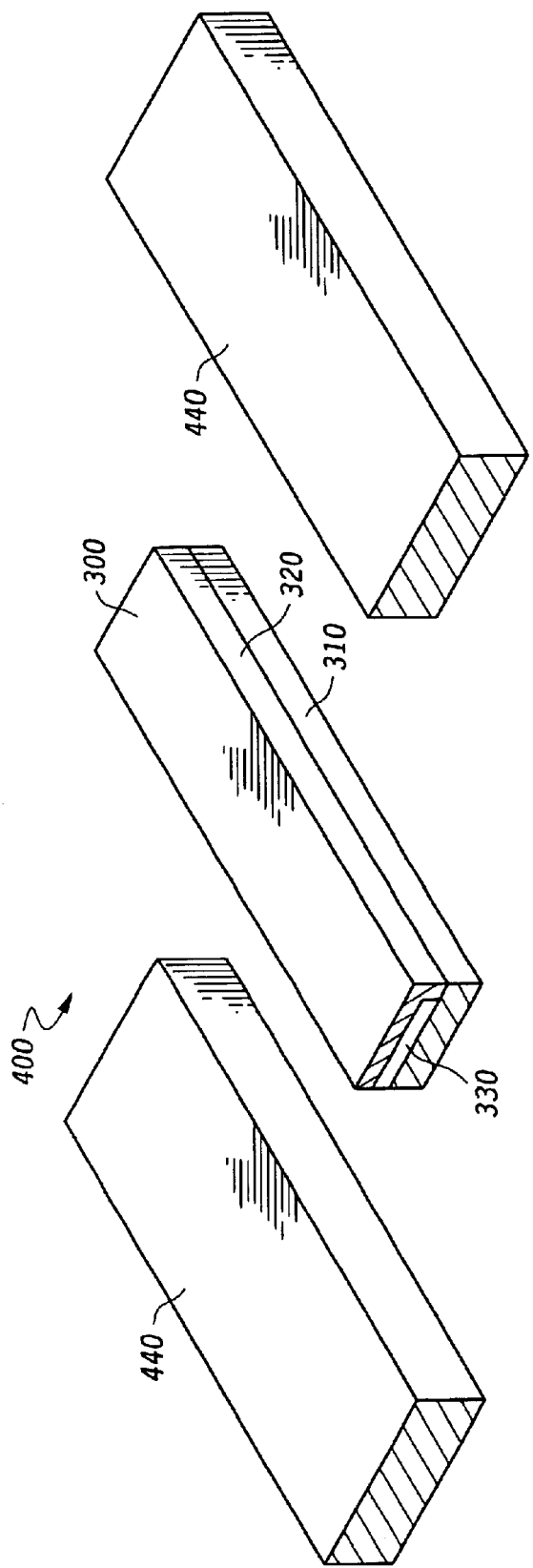
FIG. 4 is an isometric view of a cross section of a portion of a transmission line according to another embodiment of the present invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms first, second, third, fourth, and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein.

The terms left, right, front, back, top, bottom, over, under, and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term coupled, as used herein, is defined as directly or indirectly connected in a mechanical or non-mechanical manner.

DETAILED DESCRIPTION OF THE DRAWINGS

In an embodiment of the invention disclosed herein, a current-carrying structure comprises a first electrically conductive layer and a second electrically conductive layer in contact with the first electrically conductive layer along substantially the entire length of the first electrically conductive layer. The second electrically conductive layer is above the first electrically conductive layer. A non-electrically conductive layer is in contact with the first electrically conductive layer and the second electrically conductive layer along substantially the entire length of the first and second electrically conductive layers. A current travels simultaneously through the first electrically conductive layer and the second electrically conductive layer.

Figure 5:
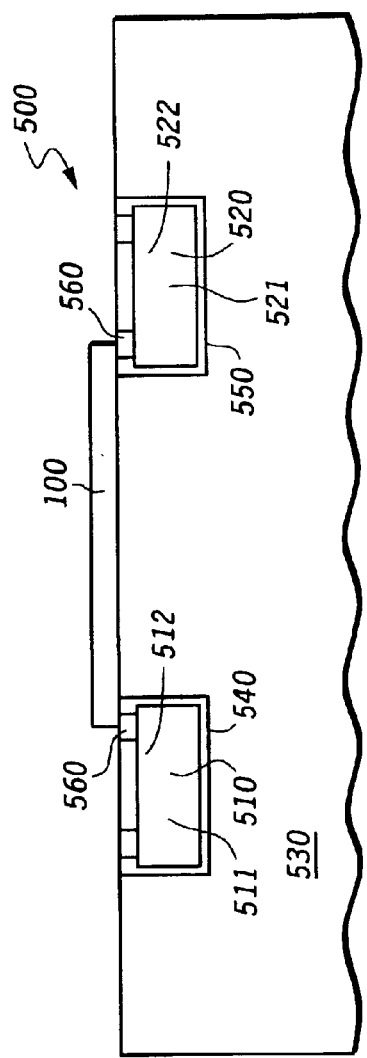
FIG. 5 is a cross-sectional view of a portion of a component-carrying structure having a current-carrying structure coupling together two chip components according to another embodiment of the present invention.

Referring now to the figures, and in particular to FIG. 1, an electronic component configured according to an embodiment of the invention comprises a current-carrying structure 100 comprising an electrically conductive layer 110 and an electrically conductive layer 120 above electrically conductive layer 110. This stacked configuration permits current-carrying structure 100 to have an increased current-carrying cross section by increasing the surface area of current-carrying structure 100 without increasing a footprint of current-carrying structure 100 over its supporting substrate. Current-carrying structure 100 may be used to form inter-chip as well as intra-chip connections, and may be formed over a wafer, including silicon and gallium arsenide (GaAs) wafers, or over a module or substrate such as that formed by high-density interconnect (HDI) organic, glass, ceramic, and Chip-Inlay surface structures. An example of a Chip-Inlay surface structure is illustrated in FIG. 5. Current-carrying structure 100 may also be formed on a printed circuit board. The formation may be accomplished by known processes, including sputter and/or evaporative depositions with photolithographic and etch processing, stencil printing, and electroplating.

Electrically conductive layer 110 may be comprised of one or more first electrically conductive materials, and electrically conductive layer 120 may be comprised of one or more second electrically conductive materials. The first and second electrically conductive materials may comprise the same or different conductive materials. For example, electrically conductive layers 110 and 120 may comprise copper, gold, silver, aluminum, tin and/or another metal. Alternatively, they may comprise doped silicon or electrically conductive adhesive.

The particular electrically conductive material for electrically conductive layers 110 and 120 may be chosen based on, among other factors, the environment in which electrically conductive layers 110 and 120 will be placed. For example, electrically conductive layer 110 may be adjacent to a first layer having adhesion properties different from those characterizing a second layer adjacent to electrically conductive layer 120. In such a case, the material forming electrically conductive layers 110 and 120 could be chosen so as to represent a good match, both in terms of adhesion and other properties, with their respective adjacent layers.

Electrically conductive layer 120 is electrically coupled to electrically conductive layer 110. As an example, electrically conductive layer 120 can be contiguous with and contacts electrically conductive layer 110 along substantially the entire length of electrically conductive layer 110. More specifically, a conductor-conductor boundary 150 between electrically conductive layer 110 and electrically conductive layer 120 comprises a substantially smooth and continuous boundary with substantially no gaps therewithin. Electrically conductive layer 10 is a symmetric structure, and electrically conductive layer 120 is also a symmetric structure.

A non-electrically conductive layer 130 is contiguous with and contacts electrically conductive layer 110 and electrically conductive layer 120. In the illustrated embodiment, electrically conductive layer 120 forms a concave structure defining a cavity 140 within electrically conductive layer 120. Non-electrically conductive layer 130 is located within cavity 140, placing it between electrically conductive layer 110 and electrically conductive layer 120. A conductor-dielectric boundary 160 is located between non-electrically conductive layers 130 and electrically conductive layers 110 and 120, and conductor-dielectric boundary 160 provides additional electrically conductive surface area for current-carrying structure 100. The amount of electrically conductive surface area is greater than that which would be available in a conventional, conductor-only configuration for a current-carrying structure. Electrons travel across the additional electrically conductive surface area as they pass through current-carrying structure 100 to reduce the impact of the skin effect.

Similar to conductor-conductor boundary 150, conductor-dielectric boundary 160 comprises a substantially smooth and continuous boundary with substantially no gaps therewithin. One of ordinary skill in the art will recognize that, notwithstanding the use of the word "dielectric" in the name of the boundary between non-electrically conductive layer 130 and electrically conductive layers 110 and 120, non-electrically conductive layer 130 may comprise one or more non-electrically conductive materials, whether or not the materials are also dielectric materials. For example, non-electrically conductive layer 130 may comprise silicon dioxide, silicon nitride, tetraethylorthosilicate, silicon oxynitride, or other low dielectric materials, such as polytetrafluoroethylene, polyimide, benzocyclobutene (BCB), and epoxy.

Current-carrying structure 100 carries a single current or signal at a time. The current passing through current-carrying structure 100 travels along a long dimension or a length of current-carrying structure 100, as represented by direction "x" in FIG. 1. A first portion of the current or signal travels through electrically conductive layer 110 while a second portion of the current or signal travels through electrically conductive layer 120 such that the first and second portions of the current or signal arrive at the same predetermined destination at an end of current-carrying structure 100 at substantially the same time. Accordingly, the current or signal passes or travels simultaneously through electrically conductive layer 110 and electrically conductive layer 120.

As an example of this simultaneous passing or traveling, the current or signal passing through a given point in electrically conductive layer 110 passes through a corresponding point in electrically conductive layer 120 at substantially the same time. Furthermore, the current or signal passes through every set of corresponding points within electrically conductive layers 110 and 120 in substantially the same manner. Corresponding points in electrically conductive layers 110 and 120 are those points that are substantially equidistant from the location of electrically conductive layers 110 and 120 at which the current was introduced into electrically conductive layers 110 and 120. The simultaneous current or signal passage described above is to be distinguished from what is referred to herein as sequential current flow, defined in this description of the invention as a situation in which current does not pass simultaneously through corresponding points of first and second electrically conductive layers.

Electrically conductive layer 120 comprises a side portion 170 and a side portion 180, and electrically conductive layer 110 comprises a side portion 190 and a side portion 195. In the embodiment of FIG. 1, side portion 170 is contiguous with and contacts side portion 190 along substantially the entire length of electrically conductive layers 110 and 120. Similarly, side portion 180 is contiguous with and contacts side portion 195, also along substantially the entire length of electrically conductive layers 110 and 120.

Referring now to FIG. 2, a current-carrying structure 200 comprises an electrically conductive layer 210 in addition to electrically conductive layer 110 and electrically conductive layer 120. Electrically conductive layer 210 is separated from electrically conductive layer 120 by a conductor-conductor boundary 250, and is located above electrically conductive layer 120 so as to preserve the benefits realized by maintaining a minimal footprint for current-carrying structure 200. Electrically conductive layer 210 is a symmetric structure and has a cavity 240. Current-carrying structure 200 further comprises a non-electrically conductive layer 230 in cavity 240, in contact with electrically conductive layers 210 and 120, and forming a conductor-dielectric boundary 260 between non-electrically conductive layer 230 and electrically conductive layers 120 and 210.

Non-electrically conductive layer 230 may comprise the same or a different material(s) as the material for non-electrically conductive layer 130, and electrically conductive layer 210 may comprise the same or a different material(s) as the material for electrically conductive layers 10 and/or 120. Conductor-conductor boundary 250 and conductor-dielectric boundary 260 are substantially similar to conductor-conductor boundary 150 and conductor-dielectric boundary 160, respectively. In another embodiment, current-carrying structure 200 may comprise additional electrically conductive layers and non-electrically conductive layers, not shown, for various applications. Considerations such as cost, vertical or height constraints, and manufacturing capabilities, among others, may determine the number of electrically conductive layers and non-electrically conductive layers in a current-carrying structure of an electronic component.

FIG. 3 depicts an alternate embodiment of a current-carrying structure. A current-carrying structure 300 in FIG. 3 comprises electrically conductive layers 310 and 320 in contact with a non-electrically conductive layer 330 and forming conductor-conductor boundary 350 and conductor-dielectric boundary 360. Non-electrically conductive layer 330 is located in a recess 340 of electrically conductive layer 320. Electrically conductive layer 310 is symmetric, while electrically conductive layer 320 is asymmetric to form a backwards "C" shape for current-carrying structure 300. Electrically conductive layer 310 includes side portions 390 and 395, and electrically conductive layer 320 includes side portions 370 and 380. Side portion 370 is contiguous with and contacts side portion 390 along substantially the entire length of electrically conductive layers 310 and 320. Side portions 380 and 395 are not contiguous with each other and do not contact each other, but each of side portions 380 and 395 are contiguous with and contact non-electrically conductive layer 330 along substantially the entire length of electrically conductive layers 310 and 320.

Figure 8:
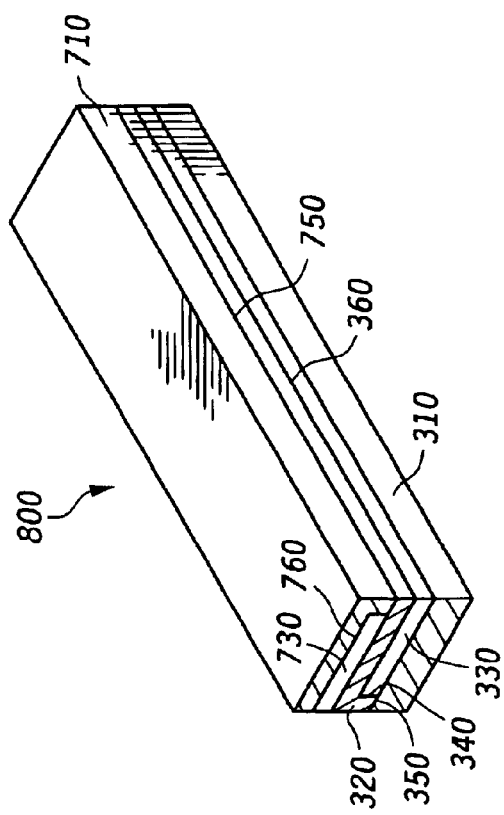
FIG. 8 is an isometric view of a cross section of a portion of a current-carrying structure according to another embodiment of the present invention.
Figure 7:
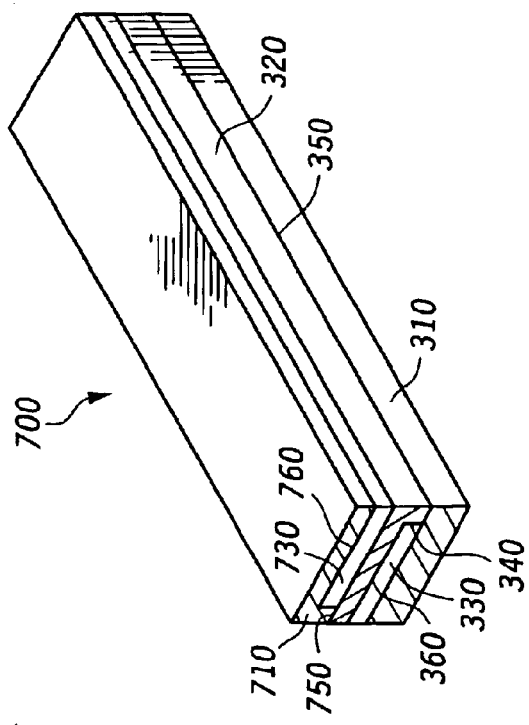
FIG. 7 is an isometric view of a cross section of a portion of a current-carrying structure according to another embodiment of the present invention.

In an alternate embodiment, current-carrying structure 300 could comprise additional electrically conductive and non-electrically conductive layers to form an "S" or "Z" shape, or current-carrying structure 300 could form other shapes. The "S" and "Z" shape embodiments are illustrated in FIGS. 7 and 8, respectively. It will also be understood that in an embodiment with three or more electrically conductive layers and two or more non-electrically conductive layers, each non-electrically conductive layer may extend to either side of the current-carrying structure, without regard for the side to which any other non-electrically conductive layer extends. Additionally, one of ordinary skill in the art will recognize that non-electrically conductive layer 330 could extend to the other side of current-carrying structure 300, placing it between side portions 370 and 390 rather than side portions 380 and 395. One of ordinary skill in the art will further recognize that current-carrying structures 100, 200, and 300 in FIGS. 1, 2, and 3, respectively, can be formed upside-down relative to the illustrated orientations.

FIG. 4 depicts a transmission line 400 according to an embodiment of the invention. Transmission line 400 comprises current-carrying structure 300, which serves as a signal line for transmission line 400. In another embodiment, the current-carrying structure of transmission line 400 can be similar to current-carrying structure 100 or 200 in FIGS. 1 and 2, respectively.

Transmission line 400 in FIG. 4 further comprises ground lines 440, which in the illustrated embodiment comprises a pair of solid, electrically conductive structures located on both sides of current-carrying structure 300 in a horizontal plane. Other embodiments of ground lines 440 may also be used. For example, ground lines 440 may comprise a single solid, electrically conductive structure located above, below, or to either side of current-carrying structure 300. Furthermore, ground lines 440 may also be similar to current-carrying structures 100, 200, or 300 in FIGS. 1, 2, and 3, respectively.

The embodiment of transmission line 400 illustrated in FIG. 4, wherein ground lines 440 are located on both sides of current-carrying structure 300 in a horizontal plane, will be referred to herein as a ground-signal-ground structure. It will be understood by one of ordinary skill in the art that transmission line 400 may also comprise structures other than the ground-signal-ground structure. For example, transmission line 400, in one embodiment, may comprise a current-carrying structure and a single ground line located side-by-side in a horizontal plane. In another embodiment, transmission line 400 may comprise a current-carrying structure located above a ground line in a vertical plane. This structure is referred to herein as a microstrip configuration. Other embodiments of transmission line 400 may also be possible.

The current-carrying structure of FIGS. 1, 2, 3, and 4 may also be incorporated, individually or collectively, into a multi-level interconnect system used, for example, in conjunction with an integrated circuit (IC). In one embodiment, only the uppermost level of the multi-level interconnect system will comprise a current-carrying structure similar to that described with reference to FIGS. 1, 2, 3, or 4. Conventionally, this uppermost level is comprised of longer electrically conductive segments than are in the lower levels, increasing the need for an increased current-carrying cross-section. In other embodiments, however, additional levels or all the levels of a multi-level interconnect system may comprise such current-carrying structures. The current-carrying structures of FIGS. 1, 2, 3, and 4 may additionally be used to form a current-carrying ribbon such as that used in tape automated bonding (TAB).

Referring now to FIG. 5, an electronic component 500 comprises a device or electronic component 510 and a device or electronic component 520 coupled together by current-carrying structure 100. Electronic component 500 is an example of what is referred to herein as a Chip-Inlay surface structure. Current-carrying structure 100 may be coupled to bonding pads 560 attached to electronic components 510 and 520. It will be understood that electronic component 510 and electronic component 520 could, in alternate embodiments, be coupled together by a current-carrying structure having any of the other configurations described herein, including those depicted in FIGS. 1, 2, 3, and 4. Multiple current-carrying structures may be formed simultaneously over component-carrying structure 530.

Referring still to FIG. 5, electronic component 500 further comprises a substrate or component-carrying structure 530, which comprises a recess 540 and a recess 550. Electric component 510 is located in recess 540, and electronic component 520 is located in recess 550. Accordingly, electronic components 510 and 520 can be considered to be "in" component-carrying structure 530.

As an example, electronic components 510 and 520 may each be packaged or unpackaged semiconductor chips. Furthermore, electronic component 510 can have an integrated circuit 511 formed in and over a semiconductor substrate, where integrated circuit 511 includes devices such as transistors and also includes a multi-level interconnect system 512. Similarly, electronic component 520 can have an integrated circuit 521 formed in and over a semiconductor substrate, where integrated circuit 521 includes devices such as transistors and also includes a multi-level interconnect system 522. Multi-level interconnect systems 512 and 522 can each have one or more of the current-carrying structures of FIGS. 1, 2, 3, and 4.

The current-carrying structures of FIGS. 1, 2, and 3 may also find application in the form of a passive device such as an inductor, a resistor, or a transformer. In the case of an inductor, for example, the increased current-carrying cross-section introduced as a result of the combination of electrically conductive layers and non-electrically conductive layers reduces loss in the inductor. Reduced loss in an inductor leads to an increase in the inductor's quality factor (Q), and ultimately to a more efficient device. It will be understood by one of ordinary skill in the art that the inductor formed with the current-carrying structure of FIGS. 1, 2, or 3 need not have the conventional inductor metal layer thickness of approximately ten micrometers. Instead, a conventional metal layer thickness of one or two micrometers may be used.

Figure 6:
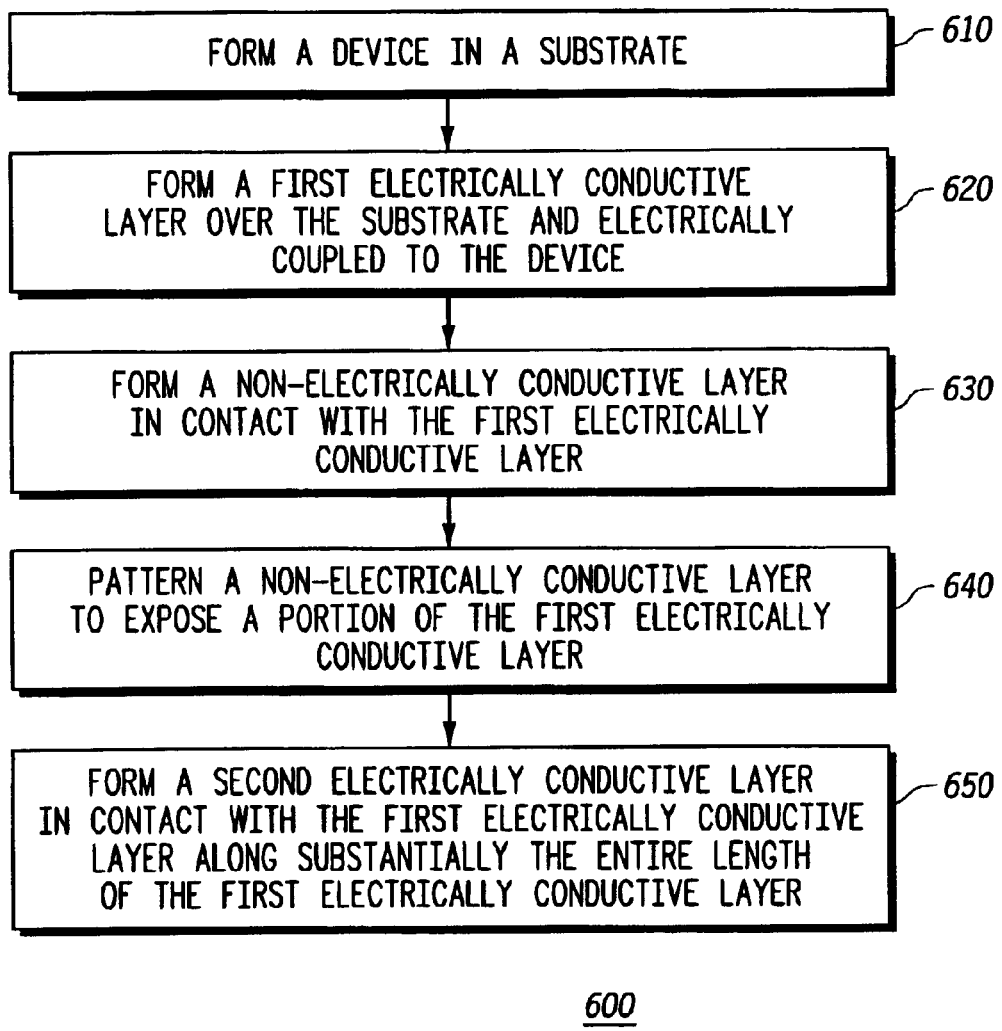
FIG. 6 is a flow chart illustrating a method of manufacturing an electronic component according to an embodiment of the present invention.

FIG. 6 contains a flowchart illustrating a method 600 for manufacturing an electronic component having a current-carrying structure according to an embodiment of the present invention. A first step 610 of method 600 is to form a device in a substrate. A second step 620 is to form a first electrically conductive layer over the substrate and electrically coupled to the device. A third step 630 of method 600 is to form a non-electrically conductive layer in contact with the first electrically conductive layer. A fourth step 640 of method 600 is to pattern the non-electrically conductive layer to expose a portion of the first electrically conductive layer. A fifth step 650 of method 600 is to form a second electrically conductive layer in contact with the first electrically conductive layer along substantially the entire length of the first electrically conductive layer.

Method 600 may be applied at various levels of electronic component manufacture. For example, method 600 may be applied at the wafer level, which includes silicon and GaAs photoresist processing. Method 600 may also be applied at the substrate level, which includes organic, ceramic, glass, and Chip-Inlay surfaces, using, among others, plating, stencil printing, and photoresist processes.

Referring now to FIG. 7, a current-carrying structure 700 comprises electrically conductive layers 310 and 320 in contact with non-electrically conductive layer 330 and forming conductor-conductor boundary 350 and conductor-dielectric boundary 360. Current-carrying structure 700 further comprises an electrically conductive layer 710 in contact with a non-electrically conductive layer 730 and forming a conductor-conductor boundary 750 and a conductor-dielectric boundary 760. In the embodiment illustrated in FIG. 7, non-electrically conductive layer 330 and non-electrically conductive layer 730 are located at opposite sides of current-carrying structure 700. Accordingly, as illustrated in FIG. 7, electrically conductive layers 310, 320, and 710 form an "S" shape when current-carrying structure 700 is seen in cross section. Electrically-conductive layer 310 is symmetric, and electrically-conductive layers 320 and 710 are asymmetric. Referring now to FIG. 8, a current-carrying structure 800 comprises a mirror image of current-carrying structure 700 of FIG. 7. Accordingly, electrically conductive layers 310, 320, and 710 form a "Z" shape when current-carrying structure 800 is seen in cross section.

Although the invention has been described with reference to specific embodiments, it will be understood by those skilled in the art that various changes may be made without departing from the spirit or scope of the invention. Various examples of such changes have been given in the foregoing description. Furthermore, as another example, conductor-conductor boundary 150 and conductor-dielectric boundary 160 in FIG. 1, conductor-conductor boundary 250 and conductor-dielectric boundary 260 in FIG. 2, and conductor-conductor boundary 350 and conductor-dielectric boundary 340 in FIG. 3 can be discontinuous and can have gaps therewithin. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the current-carrying structure discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Furthermore, the terms "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A current-carrying electronic component comprising:
a substrate; and
a current-carrying structure over the substrate and comprising:
  a first electrically conductive layer;
  a second electrically conductive layer in electrical contact with the first electrically conductive layer along substantially an entire length of the first electrically conductive layer, the length of the first electrically conductive layer measured along a longest dimension of the first electrically conductive layer; and a non-electrically conductive layer in contact with the first electrically conductive layer and the second electrically conductive layer, wherein:
a current travels simultaneously through the first electrically conductive layer and the second electrically conductive layer; and
the second electrically conductive layer is above the first electrically conductive layer;
all of the non-electrically conductive layer is under the second electrically conductive layer; and
all of the non-electrically conductive layer is over the first electrically conductive layer.

2. The current-carrying electronic component of claim 1 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer is in contact with the second side portion of the second electrically conductive layer along substantially the entire length of the first electrically conductive layer and the second electrically conductive layer.

3. The current-carrying electronic component of claim 1 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer and the second side portion of the second electrically conductive layer are in contact with the non-electrically conductive layer along substantially the entire length of the first electrically conductive layer and the second electrically conductive layer.

4. The current-carrying electronic component of claim 1 wherein:
the current-carrying structure further comprises:
a third electrically conductive layer in contact with at least one of the first electrically conductive layer and the second electrically conductive layer along substantially the entire length of the first electrically conductive layer or the second electrically conductive layer; and
a second non-electrically conductive layer in contact with at least one of the first, second, and third electrically conductive layers.

5. The current-carrying electronic component of claim 1 wherein:
the first electrically conductive layer comprises a first electrically conductive material;
the second electrically conductive layer comprises a second electrically conductive material; and
the first electrically conductive material is different from the second electrically conductive material.

6. The current-carrying electronic component of claim 1 further comprising:
a transmission line, wherein:
the current-carrying structure is a signal line in the transmission line.

7. The current-carrying electronic component of claim 6 wherein:
the transmission line further comprises an other current-carrying structure as a ground line in the transmission line; and
the other current-carrying structure comprises:
a first electrically conductive layer;
a second electrically conductive layer in contact with the first electrically conductive layer along substantially the entire length of the first electrically conductive layer; and
a non-electrically conductive layer in contact with the first electrically conductive layer and the second electrically conductive layer.

8. The current-carrying electronic component of claim 6 wherein:
the current-carrying structure further comprises:
a third electrically conductive layer in contact with at least one of the first electrically conductive layer and the second electrically conductive layer along substantially the entire length of the first electrically conductive layer or the second electrically conductive layer; and
a second non-electrically conductive layer in contact with at least one of the first, second, and third electrically conductive layers.

9. The current-carrying electronic component of claim 6 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer is in contact with the second side portion of the second electrically conductive layer along substantially the entire length of the first electrically conductive layer and the second electrically conductive layer.

10. The current-carrying electronic component of claim 6 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer and the second side portion of the second electrically conductive layer are in contact with the non-electrically conductive layer along substantially the entire length of the first electrically conductive layer and the second electrically conductive layer.

11. The current-carrying electronic component of claim 1 wherein:

the current-carrying structure comprises a device selected from the group consisting of an inductor, a resistor, and a transformer.

12. The current-carrying electronic component of claim 1 further comprising:
a first semiconductor chip and a second semiconductor chip,
wherein:
the first semiconductor chip and the second semiconductor chip are electrically coupled together by the current-carrying structure.

13. The current-carrying electronic component of claim 12 further comprising:
a component-carrying structure having a first recess and a second recess,
wherein:
the first semiconductor chip is in the first recess and the second semiconductor chip is in the second recess.

14. The current-carrying electronic component of claim 13 wherein:
the current-carrying structure further comprises:
a third electrically conductive layer in contact with at least one of the first electrically conductive layer and the second electrically conductive layer along substantially the entire length of the first electrically conductive layer or the second electrically conductive layer; and
a second non-electrically conductive layer in contact with at least one of the first, second, and third electrically conductive layers.

15. The current-carrying electronic component of claim 13 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer is in contact with the second side portion of the second electrically conductive layer along substantially the entire length of the first electrically conductive layer and the second electrically conductive layer.

16. The current-carrying electronic component of claim 13 wherein:
the first electrically conductive layer comprises a first side portion and a second side portion;
the second electrically conductive layer comprises a first side portion and a second side portion;
the first side portion of the first electrically conductive layer is in contact with the first side portion of the second electrically conductive layer along substantially the entire length of the first electrically conductive layer and the second electrically conductive layer; and
the second side portion of the first electrically conductive layer and the second side portion of the second electrically conductive layer are in contact with the non-electrically conductive layer along substantially the entire length of the first electrically conductive layer and the second electrically conductive layer.

17. The current-carrying electronic component of claim 1 wherein:
the first electrically conductive layer and the second electrically conductive layer form a composite structure having an increased current-carrying cross-section of the current-carrying structure compared to a current-carrying structure consisting of one of the first or second electrically conductive layer.

18. The current-carrying electronic component of claim 1 wherein:
the first electrically conductive layer, the second electrically conductive layer, and the non-electrically conductive layer are of substantially equal length.

19. A current-carrying electronic component comprising:
a substrate; and
a current-carrying structure over the substrate and comprising:
a first electrically conductive layer;
a second electrically conductive layer in electrical contact with the first electrically conductive layer along substantially an entire length of the first electrically conductive layer, the length of the first electrically conductive layer measured along a longest dimension of the first electrically conductive layer; and
a non-electrically conductive layer in contact with the first electrically conductive layer and the second electrically conductive layer,
wherein:
all of the non-electrically conductive layer is under the second electrically conductive layer;
all of the non-electrically conductive layer is over the first electrically conductive layer; and
the first electrically conductive layer and the second electrically conductive layer form a composite structure having an increased current-carrying cross-section of the current-carrying structure compared to a current-carrying structure consisting of one of the first or second electrically conductive layer.

20. A current-carrying electronic component comprising:
a substrate;
a grounding service located on or within the substrate; and
a current-carrying structure having a length, a width, and a height, the current-carrying structure located over the substrate and comprising:
a first electrically conductive layer;
a second electrically conductive layer in electrical contact with the first electrically conductive layer along substantially an entire length of the first electrically conductive layer; and
a non-electrically conductive layer in contact with the first electrically conductive layer and the second electrically conductive layer,
wherein:
a current travels simultaneously through the first electrically conductive layer and the second electrically conductive layer;
the second electrically conductive layer is above the first electrically conductive layer; and
the length exceeds the width and the height by at least a factor of ten.

21. The current-carrying electronic component of claim 20 wherein:
all of the non-electrically conductive layer is under the second electrically conductive layer; and all of the non-electrically conductive layer is over the first electrically conductive layer.

22. The current-carrying electronic component of claim 21 wherein:
the first electrically conductive layer and the second electrically conductive layer form a composite structure having an increased current-carrying cross-section of the current-carrying structure compared to a current-carrying structure consisting of only one of the first or second electrically conductive layer.

23. The current-carrying electronic component of claim 20 wherein:
the current travels through the first and second electrically conductive layers substantially only along the length of the current-carrying structure.

24. The current-canying electronic component of claim 20 wherein:
the current-carrying structure comprises a controlled impedance structure.

25. The current-carrying electronic component of claim 24 wherein:
the current-carrying structure is planar.

* * * * *